US010804917B1

(12) United States Patent
Chang et al.

(10) Patent No.: US 10,804,917 B1
(45) Date of Patent: Oct. 13, 2020

(54) SAR ADC AND A REFERENCE RIPPLE SUPPRESSION CIRCUIT ADAPTABLE THERETO

(71) Applicants: NCKU Research and Development Foundation, Tainan (TW); Himax Technologies Limited, Tainan (TW)

(72) Inventors: Soon-Jyh Chang, Tainan (TW); Hao-Sheng Wu, Tainan (TW)

(73) Assignees: NCKU Research and Development Foundation, Tainan (TW); Himax Technologies Limited, Tainan (TW)

(*) Notice: Subject to any disclaimer, the term of this patent is extended or adjusted under 35 U.S.C. 154(b) by 0 days.

(21) Appl. No.: 16/677,494

(22) Filed: Nov. 7, 2019

(51) Int. Cl.
*H03M 1/08* (2006.01)
*H03M 1/38* (2006.01)
*H03M 1/40* (2006.01)
*H03M 1/18* (2006.01)

(52) U.S. Cl.
CPC .......... *H03M 1/0845* (2013.01); *H03M 1/38* (2013.01); *H03M 1/0863* (2013.01); *H03M 1/182* (2013.01); *H03M 1/40* (2013.01); *H03M 1/403* (2013.01)

(58) Field of Classification Search
CPC ...... H03M 1/0845; H03M 1/38; H03M 1/403; H03M 1/40; H03M 1/182; H03M 1/12; H03M 1/0863
USPC .................................................. 341/118, 172
See application file for complete search history.

(56) References Cited

U.S. PATENT DOCUMENTS

| 8,436,677 B2 * | 5/2013 | Kull ........................ G11C 5/147 |
| | | 327/541 |
| 9,154,151 B1 * | 10/2015 | Leong ................. H03M 1/0863 |
| 10,236,903 B2 | 3/2019 | Lin et al. |

OTHER PUBLICATIONS

Ying-Zu Lin et al., "A 8.2-mW 10-b 1.6-GS/s 4x TI SAR ADC with Fast Reference Charge Neutralization and Background Timing-Skew Calibration in 16-nm CMOS," IEEE 2016 Symposium on VLSI Circuits Digest of Technical Papers.

* cited by examiner

*Primary Examiner* — Khai M Nguyen
(74) *Attorney, Agent, or Firm* — Donald E. Stout; Stout, Uxa & Buyan, LLP

(57) ABSTRACT

A reference ripple suppression circuit adaptable to a successive approximation register (SAR) analog-to-digital converter (ADC) includes a plurality of code-dependent compensation cells, each including a logic circuit and a compensation capacitor. A first plate of the compensation capacitor is coupled to receive a reference voltage to be compensated, and a second plate of the compensation capacitor is coupled to receive an output of the logic circuit performing on an output code of the SAR ADC and at least one logic value representing a bottom-plate voltage of a switched digital-to-analog converter (DAC) of the SAR ADC. (k−1) of the code-dependent compensation cells are required maximally for k-th switching of the SAR ADC.

20 Claims, 5 Drawing Sheets

| | $B_p[k]$ | $B_n[k]$ | $bot_p[i]$ | $bot_n[i]$ | output |
|---|---|---|---|---|---|
| Sampling | 0 | 0 | 0 | 0 | 0 |
| conversion | 0 | 1 | 1 | 0 | 0 |
| | 0 | 1 | 0 | 1 | 1 |
| | 1 | 0 | 1 | 0 | 1 |
| | 1 | 0 | 0 | 1 | 0 |

SAR ADC AND A REFERENCE RIPPLE SUPPRESSION CIRCUIT ADAPTABLE THERETO

BACKGROUND OF THE INVENTION

1. Field of the Invention

The present invention generally relates to an analog-to-digital converter (ADC), and more particularly to a successive approximation register (SAR) ADC with low-complexity code-dependent reference ripple suppression.

2. Description of Related Art

A successive approximation register (SAR) analog-to-digital converter (ADC) is a type of ADC that coverts an analog signal to a digital equivalent of the signal. The SAR ADC performs conversion by comparison and searching through all possible quantization levels to obtain a digital output. The SAR ADC requires less silicon area and power consumption than other ADC architectures.

However, if the reference generation circuit is considered, its power consumption can sometimes overwhelm that of the SAR ADC core itself. SAR ADCs are required to repetitively switch the capacitive digital-to-analog converter (DAC), which repetitively draws currents from the reference generation circuit within one sampling period, making the driving issue of the reference generation circuit difficult. Moreover, the conventional SAR ADC suffers non-linearity, particularly differential nonlinearity (DNL).

For the foregoing reasons, a need has arisen to propose a novel SAR ADC with linearity, power and area improvement.

SUMMARY OF THE INVENTION

In view of the foregoing, it is an object of the embodiment of the present invention to provide a successive approximation register (SAR) analog-to-digital converter (ADC) with low-complexity code-dependent reference ripple suppression capable of suppressing effect of differential nonlinearity (DNL) to achieve further power or area savings on the reference generation circuitry.

According to one embodiment, a reference ripple suppression circuit adaptable to a successive approximation register (SAR) analog-to-digital converter (ADC) includes a plurality of code-dependent compensation cells, each including a logic circuit and a compensation capacitor. A first plate of the compensation capacitor is coupled to receive a reference voltage to be compensated, and a second plate of the compensation capacitor is coupled to receive an output of the logic circuit performing on an output code of the SAR ADC and at least one logic value representing a bottom-plate voltage of a switched digital-to-analog converter (DAC) of the SAR ADC. (k−1) of the code-dependent compensation cells are required maximally for k-th switching of the SAR ADC, where k is a positive integer from 1 to (n−1) for an n-bit SAR ADC, n being a positive integer greater than one.

DETAILED DESCRIPTION OF THE INVENTION

Figure 1:
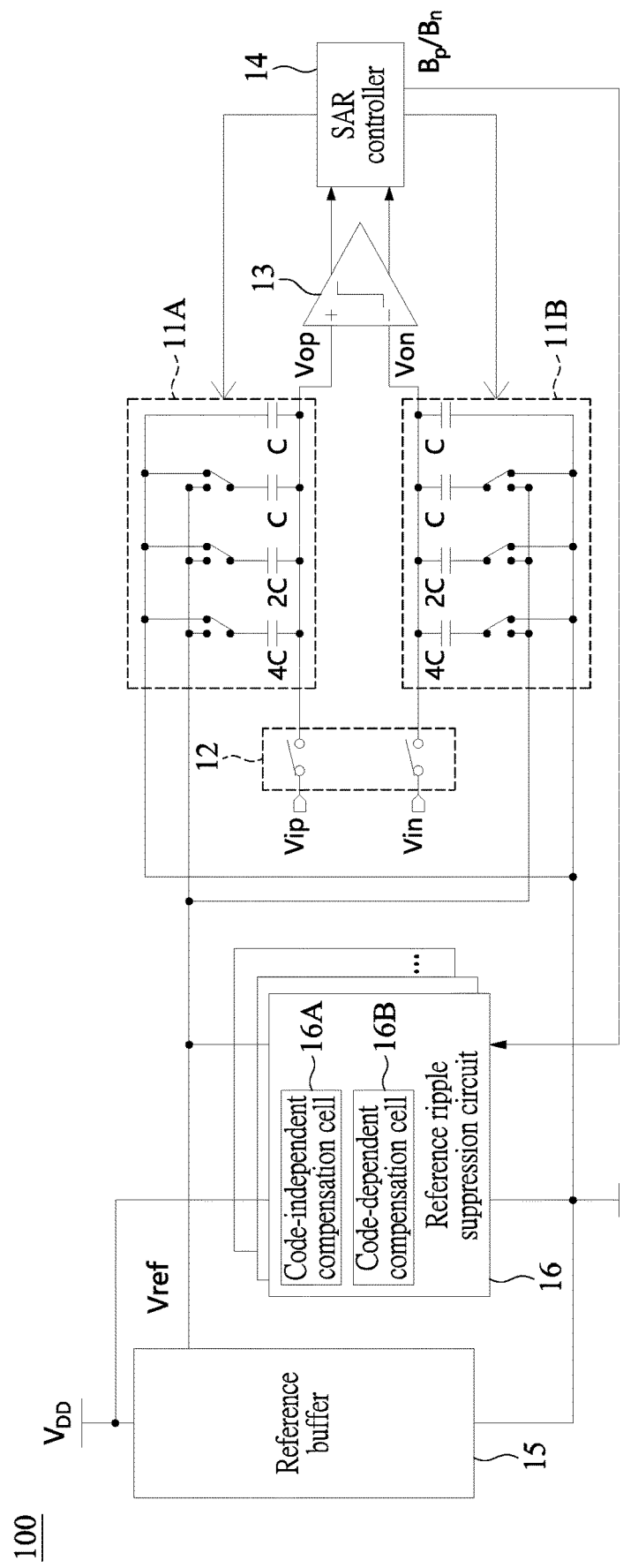
FIG. 1 shows a block diagram illustrating a successive approximation register (SAR) analog-to-digital converter (ADC) with low-complexity code-dependent reference ripple suppression according to one embodiment of the present embodiment.

FIG. 1 shows a block diagram illustrating a successive approximation register (SAR) analog-to-digital converter (ADC) 100 with low-complexity code-dependent reference ripple suppression according to one embodiment of the present embodiment.

In the embodiment, the SAR ADC 100 may include at least one switched digital-to-analog converter (DAC) such as a first DAC 11A (e.g., a capacitor array) and a second DAC 11B (e.g., a capacitor array) that are coupled to receive a first input signal Vip and a second input signal Vin respectively through bootstrapped switches 12, and are configured to generate a first output signal Vop and a second output signal Von respectively.

The SAR ADC 100 of the embodiment may include a comparator 13 coupled to receive the first output signal Vop and the second output signal Von at a first input node (e.g., a positive (+) input node) and a second input node (e.g., a negative (−) input node) of the comparator 13, respectively. The SAR ADC 100 may include a SAR controller 14 configured to generate an output code from the most significant bit (MSB) to least significant bit (LSB) in sequence according to a comparison output of the comparator 13. The SAR ADC 100 may further control switching of the first DAC 11A and the second DAC 11B according to the comparison output of the comparator 13. In the embodiment, differential signaling is adopted, and the output code may include a differential pair of signals such as a code pair composed of $B_p$ and $B_n$, where $B_n$ is an inverse logic value of (or complementary to) $B_p$. In another embodiment, single-ended signaling is adopted, and the output code may include a single output value.

In the embodiment, the SAR ADC 100 may include a reference buffer 15 configured to generate a reference voltage Vref for the first DAC 11A and the second DAC 11B. According to one aspect of the embodiment, the SAR ADC 100 may include a reference ripple suppression circuit 16 that may be configured to suppress reference ripple of the reference voltage Vref and may include a plurality of code-independent compensation cells 16A and a plurality of code-dependent compensation cells 16B.

Figure 2:
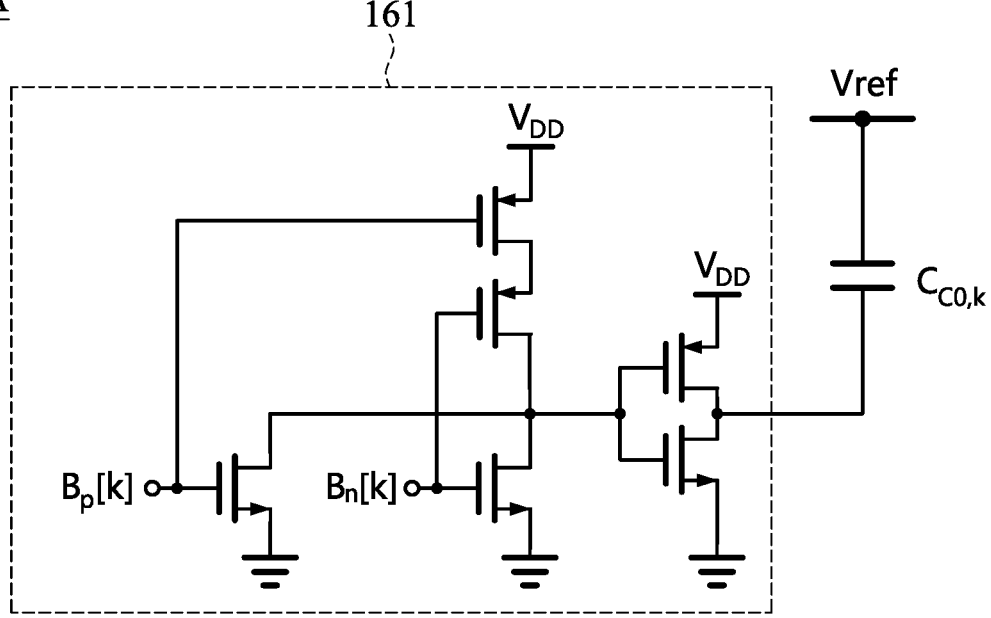
FIG. 2 shows a circuit diagram illustrating a code-independent compensation cell of the reference ripple suppression circuit of FIG. 1 according to one embodiment of the present invention.

FIG. 2 shows a circuit diagram illustrating a code-independent compensation cell 16A of the reference ripple suppression circuit 16 of FIG. 1 according to one embodiment of the present invention. In the embodiment, one code-independent compensation cell 16A is required for each switching (of the first DAC 11A and the second DAC 11B). The code-independent compensation cell 16A may include a first logic circuit 161 and a first compensation capacitor $C_{C0,k}$ for k-th switching. A first plate of the first compensation capacitor $C_{C0,k}$ is coupled to receive the reference voltage Vref to be compensated, and a second plate of the first compensation capacitor $C_{C0,k}$ is coupled to receive an output of the first logic circuit 161 of the code-independent compensation cell 16A. For an n-bit SAR ADC 100 (n is a positive integer preferably greater than one) that may perform switching (n−1) times, (n−1) code-independent compensation cells 16A (and the corresponding first compensation capacitors $C_{C0,k}$) are required maximally, where k is a positive integer from 1 to (n−1). For example, a 4-bit SAR ADC 100 has a total of three first compensation capacitors $C_{C0,1}$, $C_{C0,2}$ and $C_{C0,3}$. In one embodiment, capacitance $C_{C0}(k)$ of the first compensation capacitor $C_{C0,k}$ may be expressed as:

$$C_{C0}(k) = \frac{C_S(k) \cdot \sum_{j=k+1}^{N} C(j)}{C_{DAC}} \frac{Vref}{V_{DD}}$$

where $C_S(k)$ is switched capacitance for the k-th switching, N is a resolution of the SAR ADC 100, $C(j)$ is a j-th capacitor in a switched DAC (e.g., the first DAC 11A), Vref is the reference voltage to be compensated, $C_{DAC}$ is total capacitance of the switched DAC (e.g., the first DAC 11A), and $V_{DD}$ is a power voltage.

Specifically, the code-independent compensation cell 16A is coupled to receive a code pair composed of $B_p[k]$ (first element) and $B_n[k]$ (second element), where k represents the k-th switching. The first logic circuit 161 of the code-independent compensation cell 16A is configured to perform, for example, OR logic on the code pair $B_p$ and $B_n$.

Figures 3A, 3B:
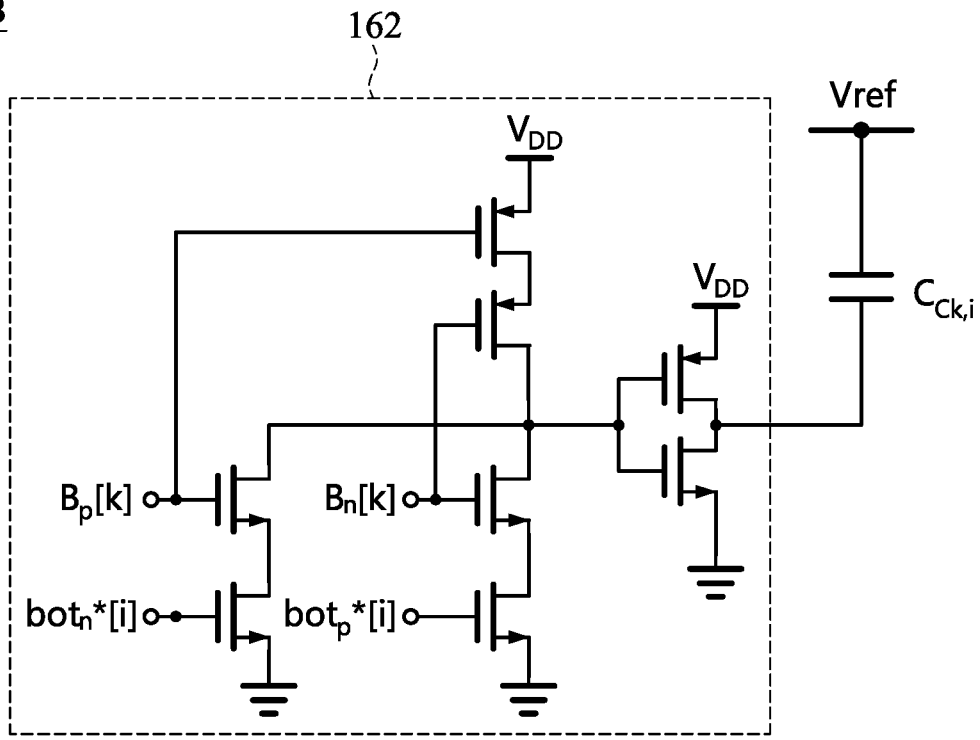
FIG. 3A shows a circuit diagram illustrating a code-dependent compensation cell according to one embodiment of the present invention.
FIG. 3B shows a logic truth table according to which the second logic circuit of the code-dependent compensation cell of FIG. 3A performs logic operation.
Figure 4A:
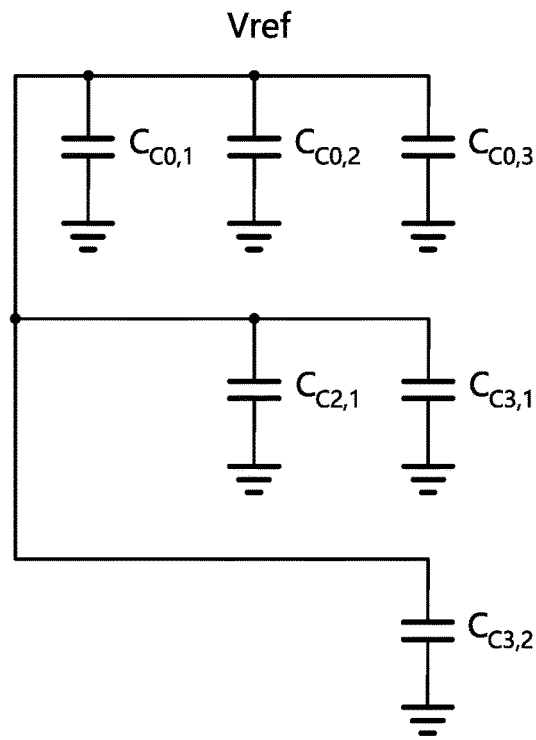
FIG. 4A to FIG. 4D show an exemplary reference compensation mechanism for a 4-bit SAR ADC.
Figure 4B:
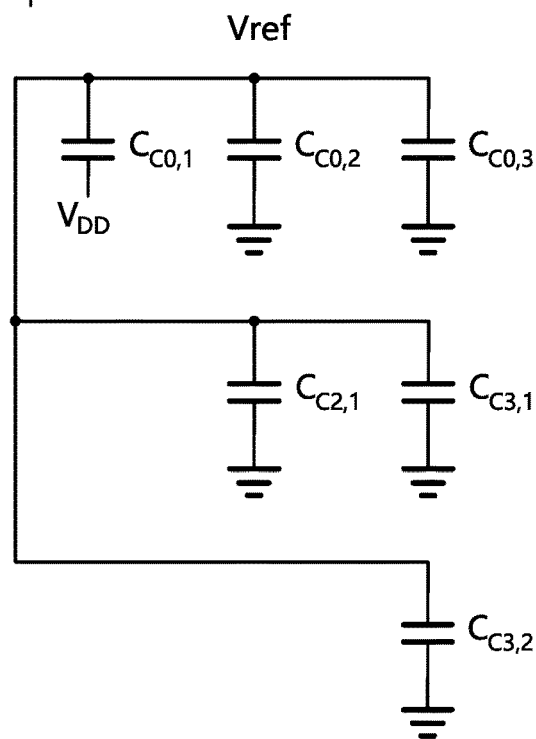
Figure 4C:
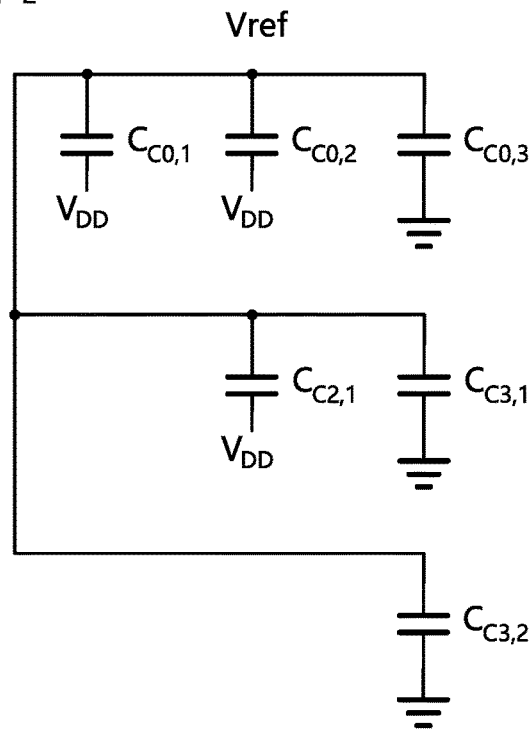
Figure 4D:
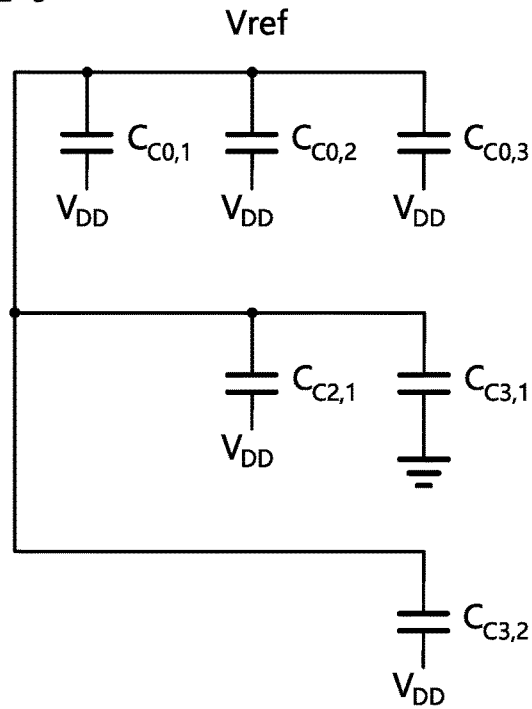

FIG. 3A shows a circuit diagram illustrating a code-dependent compensation cell 16B according to one embodiment of the present invention. In the embodiment, (k−1) code-dependent compensation cell 16B are required maximally for k-th switching (of the first DAC 11A and the second DAC 11B). The i-th code-dependent compensation cell 16B may include a second logic circuit 162 and a second compensation capacitor $C_{Ck,i}$ for k-th switching, where i is a positive integer from 1 to (k−1), and k=1 to (n−1) for an n-bit SAR ADC 100. For example, a 4-bit SAR ADC 100 has one second compensation capacitor $C_{C2,1}$ for the second switching, and two second compensation capacitors $C_{C3,1}$ and $C_{C3,2}$ for the third switching. A first plate of the second compensation capacitor $C_{Ck,i}$ is coupled to receive the reference voltage Vref to be compensated, and a second plate of the second compensation capacitor $C_{Ck,i}$ is coupled to receive an output of the second logic circuit 162 of the code-dependent compensation cell 16B. In one embodiment, capacitance $C_C(k,i)$ of the second compensation capacitor $C_{Ck,i}$ may be expressed as:

$$C_C(k,i) = \frac{C_S(k) \cdot C(i)}{C_{DAC}} \frac{Vref}{V_{DD}}$$

Specifically, the code-dependent compensation cell 16B is coupled to receive a code pair composed of $B_p[k]$ (first element) and $B_n[k]$ (second element) and a plate signal pair composed of $bot_p*[i]$ (first element) and $bot_n*[i]$ (second element), where $bot_p*$ represents an inverse logic value representing a bottom-plate voltage of a switched DAC, $bot_n*$ represents an inverse logic value of $bot_p*$, k represents the k-th switching and i represents the i-th code-dependent compensation cell 16B. The second logic circuit 162 of the code-dependent compensation cell 16B is configured to perform logic operation on the code pair $B_y[k]/B_n[k]$ and the plate signal pair $bot_p*[i]/bot_n*[i]$ in sampling period and conversion period according to a logic truth table shown in FIG. 3B. Accordingly, the second logic circuit 162 of the code-dependent compensation cell 16B may perform logic operation based on a current output code $B_p/B_n$ and a preceding output code $bot_p/bot_n$ represented by a logic value of the bottom-plate voltage of the switched DAC. In the specification, the bottom plate is referred to the plate of a capacitor of the first/second DAC 11A/11B to be switched to the reference voltage Vref or ground.

FIG. 4A to FIG. 4D show an exemplary reference compensation mechanism for a 4-bit SAR ADC 100 illustrating the first compensation capacitors $C_{C0,k}$ for k-th switching (of the code-independent compensation cells 16A) and the second compensation capacitor $C_{Ck,i}$ for k-th switching (of the i-th code-dependent compensation cell 16B) in sampling period and conversion period. In this example, first three bits $B_1B_2B_3$ of the output code generated by the SAR controller 14 is "101". As described above, a 4-bit SAR ADC 100 has a maximum of three first compensation capacitors $C_{C0,1}$, $C_{C0,2}$ and $C_{C0,3}$; and has one second compensation capacitor $C_{C2,1}$ for the second switching, and two second compensation capacitors $C_{C3,1}$ and $C_{C3,2}$ for the third switching.

Specifically, in sampling period (FIG. 4A), the outputs of the code-independent compensation cells 16A and the code-dependent compensation cell 16B are "0", and all the first and second compensation capacitors are grounded. Next, in the first-switching of conversion period with the first bit $B_1$ ("1") of the generated output code as exemplified in FIG. 4B, the output of the code-independent compensation cell 16A corresponding to the first compensation capacitor $C_{C0,1}$ is "1", thereby electrically connecting the first compensation capacitor $C_{C0,1}$ to a power voltage $V_{DD}$. Similarly, in the second-switching of conversion period with the first two bits $B_1B_2$ ("10") of the generated output code as exemplified in FIG. 4C, the first compensation capacitor $C_{C0,2}$ is electrically connected to the power voltage $V_{DD}$ (due to output "1" in the corresponding code-independent compensation cell 16A) and the second compensation capacitor $C_{C2,1}$ is electrically connected to the power voltage $V_{DD}$ (due to output "1" in the corresponding code-dependent compensation cell 16B). Finally, in the third-switching of conversion period with the first three bits $B_1B_2B_3$ ("101") of the generated output code as exemplified in FIG. 4D, the first compensation capacitor $C_{C0,3}$ is electrically connected to the power voltage $V_{DD}$ (due to output "1" in the corresponding code-independent compensation cell 16A) and the second compensation capacitor $C_{C3,2}$ is electrically connected to the power voltage $V_{DD}$ (due to output "1" in the corresponding code-dependent compensation cell 163).

It is appreciated that not all of the code-independent compensation cells 16A and the code-dependent compensation cells 16B need be applied. In one exemplary embodiment, only code-independent compensation cells 16A and code-dependent compensation cells 16B corresponding to m-th and later switchings are adopted with the reference ripples occurring in the uncompensated switching steps tolerated by adding redundancies (where m is a positive integer greater than two, e.g., m=3).

In another exemplary embodiment, only code-independent compensation cells 16A and code-dependent compensation cells 16B with the first and the second compensation capacitors having large capacitance are adopted. In this specification, the term "large" capacitance refers to the capacitance being larger than a predetermined threshold.

According to the embodiment as set forth above, a maximum number of the code-independent compensation cells 16A and the code-dependent compensation cells 16B grows only linearly with the number of switchings (or bits) of the SAR ADC 100. To the contrary, in the conventional SAR ADC, such as that disclosed in U.S. Pat. No. 10,236,903, entitled "CHARGE COMPENSATION CIRCUIT AND ANALOG-TO-DIGITAL CONVERTER WITH THE SAME," the number of compensation cells grows exponentially with the number of switchings (or bits) of the SAR ADC.

Although specific embodiments have been illustrated and described, it will be appreciated by those skilled in the art that various modifications may be made without departing from the scope of the present invention, which is intended to be limited solely by the appended claims.

What is claimed is:

1. A reference ripple suppression circuit adaptable to a successive approximation register (SAR) analog-to-digital converter (ADC), comprising:
   a plurality of code-dependent compensation cells, each including a logic circuit and a compensation capacitor, a first plate of the compensation capacitor being coupled to receive a reference voltage to be compensated, and a second plate of the compensation capacitor being coupled to receive an output of the logic circuit performing on an output code of the SAR ADC and at least one logic value representing a bottom-plate voltage of a switched digital-to-analog converter (DAC) of the SAR ADC;
   wherein (k−1) of the code-dependent compensation cells are required maximally for k-th switching of the SAR ADC, where k is a positive integer from 1 to (n−1) for an n-bit SAR ADC, n being a positive integer greater than one.

2. The reference ripple suppression circuit of claim 1, wherein the output code comprises a code pair composed of $B_p[k]$ and $B_n[k]$, and the at least one logic value of the bottom-plate voltage comprises a plate signal pair composed of $bot_p*[i]$ and $bot_n*[i]$, where i is a positive integer from 1 to (k−1), $B_n[k]$ is an inverse logic value of $B_p[k]$, $bot_p*[i]$ represents an inverse logic value of the bottom-plate voltage of the switched DAC, and $bot_n*[i]$ represents an inverse logic value of $bot_p*[i]$.

3. The reference ripple suppression circuit of claim 2, wherein the logic circuit performs logic operation in sampling period and conversion period according to a logic truth table below:

|  | $B_p[k]$ | $B_n[k]$ | $bot_p[i]$ | $bot_n[i]$ | output |
|---|---|---|---|---|---|
| sampling | 0 | 0 | 0 | 0 | 0 |
| conversion | 0 | 1 | 1 | 0 | 0 |
|  | 0 | 1 | 0 | 1 | 1 |
|  | 1 | 0 | 1 | 0 | 1 |
|  | 1 | 0 | 0 | 1 | 0 |

4. The reference ripple suppression circuit of claim 1, wherein only the code-dependent compensation cells corresponding to m-th and later switchings are adopted with reference ripples occurring in uncompensated switching steps tolerated by adding redundancies, where m is a positive integer greater than two.

5. The reference ripple suppression circuit of claim 1, wherein only the code-dependent compensation cells with the compensation capacitor having capacitance larger than a predetermined threshold are adopted.

6. The reference ripple suppression circuit of claim 1, wherein a maximum number of the code-dependent compensation cells grows linearly with a number of switchings of the SAR ADC.

7. A reference ripple suppression circuit adaptable to a successive approximation register (SAR) analog-to-digital converter (ADC), comprising:
   a plurality of code-independent compensation cells, each including a first logic circuit and a first compensation capacitor, a first plate of the first compensation capacitor being coupled to receive a reference voltage to be compensated, and a second plate of the first compensation capacitor being coupled to receive an output of the first logic circuit performing on an output code of the SAR ADC; and
   a plurality of code-dependent compensation cells, each including a second logic circuit and a second compensation capacitor, a first plate of the second compensation capacitor being coupled to receive the reference voltage to be compensated, and a second plate of the second compensation capacitor being coupled to receive an output of the second logic circuit performing on the output code of the SAR ADC and at least one logic value representing a bottom-plate voltage of a switched digital-to-analog converter (DAC) of the SAR ADC;
   wherein (n−1) of the code-independent compensation cells are required maximally for an n-bit SAR ADC, (k−1) of the code-dependent compensation cells are required maximally for k-th switching of the SAR ADC, where n is a positive integer greater than one and k is a positive integer from 1 to (n−1).

8. The reference ripple suppression circuit of claim 7, wherein the output code comprises a differential pair of signals, on which the first logic circuit performs logic operation.

9. The reference ripple suppression circuit of claim 8, wherein the logic operation performed by the first logic circuit comprises OR logic.

10. The reference ripple suppression circuit of claim 7, wherein the output code comprises a code pair composed of $B_p[k]$ and $B_n[k]$, and the at least one logic value of the bottom-plate voltage comprises a plate signal pair composed of $bot_p*[i]$ and $bot_n*[i]$, where i is a positive integer from 1 to (k−1), $B_n[k]$ is an inverse logic value of $B_p[k]$, $bot_p*[i]$ represents an inverse logic value of the bottom-plate voltage of the switched DAC, and $bot_n*[i]$ represents an inverse logic value of $bot_p*[i]$.

11. The reference ripple suppression circuit of claim 10, wherein the second logic circuit performs logic operation in sampling period and conversion period according to a logic truth table below:

|  | $B_p[k]$ | $B_n[k]$ | $bot_p[i]$ | $bot_n[i]$ | output |
|---|---|---|---|---|---|
| sampling | 0 | 0 | 0 | 0 | 0 |
| conversion | 0 | 1 | 1 | 0 | 0 |
|  | 0 | 1 | 0 | 1 | 1 |
|  | 1 | 0 | 1 | 0 | 1 |
|  | 1 | 0 | 0 | 1 | 0 |

12. The reference ripple suppression circuit of claim 7, wherein only the code-independent compensation cells and the code-dependent compensation cells corresponding to m-th and later switchings are adopted with reference ripples occurring in uncompensated switching steps tolerated by adding redundancies, where m is a positive integer greater than two.

13. The reference ripple suppression circuit of claim 7, wherein only the code-independent compensation cells and the code-dependent compensation cells with the first and the second compensation capacitors having capacitance larger than a predetermined threshold are adopted.

14. The reference ripple suppression circuit of claim 7, wherein a maximum number of the code-independent compensation cells and the code-dependent compensation cells grows linearly with a number of switchings of the SAR ADC.

15. A successive approximation register (SAR) analog-to-digital converter (ADC), comprising:
   at least one switched digital-to-analog converter (DAC) coupled to receive an input signal and configured to generate an output signal;
   a comparator coupled to receive the output signal;
   a SAR controller that generates an output code according to a comparison output of the comparator;
   a reference buffer that generates a reference voltage for the switched DAC; and
   a reference ripple suppression circuit that suppresses reference ripple of the reference voltage, the reference ripple suppression circuit including:
   a plurality of code-independent compensation cells, each including a first logic circuit and a first compensation capacitor, a first plate of the first compensation capacitor being coupled to receive the reference voltage, and a second plate of the first compensation capacitor being coupled to receive an output of the first logic circuit performing on the output code of the SAR ADC; and
   a plurality of code-dependent compensation cells, each including a second logic circuit and a second compensation capacitor, a first plate of the second compensation capacitor being coupled to receive the reference voltage, and a second plate of the second compensation capacitor being coupled to receive an output of the second logic circuit performing on the output code of the SAR ADC and at least one logic value representing a bottom-plate voltage of the switched DAC;
   wherein (n−1) of the code-independent compensation cells are required maximally for an n-bit SAR ADC, (k−1) of the code-dependent compensation cells are required maximally for k-th switching of the SAR ADC, where n is a positive integer greater than one and k is a positive integer from 1 to (n−1).

16. The SAR ADC of claim 15, wherein the output code comprises a differential pair of signals, on which the first logic circuit performs logic operation.

17. The SAR ADC of claim 16, wherein the logic operation performed by the first logic circuit comprises OR logic.

18. The SAR ADC of claim 15, wherein the output code comprises a code pair composed of $B_p[k]$ and $B_n[k]$, and the at least one logic value of the bottom-plate voltage comprises a plate signal pair composed of $bot_p*[i]$ and $bot_n*[i]$, where i is a positive integer from 1 to (k−1), $B_n[k]$ is an inverse logic value of $B_p[k]$, $bot_p*[i]$ represents an inverse logic value of the bottom-plate voltage of the switched DAC, and $bot_n*[i]$ represents an inverse logic value of $bot_p*[i]$.

19. The SAR ADC of claim 18, wherein the second logic circuit performs logic operation in sampling period and conversion period according to a logic truth table below:

|  | $B_p[k]$ | $B_n[k]$ | $bot_p[i]$ | $bot_n[i]$ | output |
|---|---|---|---|---|---|
| sampling | 0 | 0 | 0 | 0 | 0 |
| conversion | 0 | 1 | 1 | 0 | 0 |
|  | 0 | 1 | 0 | 1 | 1 |
|  | 1 | 0 | 1 | 0 | 1 |
|  | 1 | 0 | 0 | 1 | 0 |

20. The SAR ADC of claim 15, wherein only the code-independent compensation cells and the code-dependent compensation cells corresponding to m-th and later switchings are adopted with reference ripples occurring in uncompensated switching steps tolerated by adding redundancies, where m is a positive integer greater than two.

* * * * *